United States Patent [19]

Nogami et al.

[11] Patent Number: 5,968,333
[45] Date of Patent: Oct. 19, 1999

[54] METHOD OF ELECTROPLATING A COPPER OR COPPER ALLOY INTERCONNECT

[75] Inventors: Takeshi Nogami, Sunnyvale; Valery Dubin; Robin Cheung, both of Cupertino, all of Calif.

[73] Assignee: Advanced Micro Devices, Inc., Sunnyvale, Calif.

[21] Appl. No.: 09/055,876

[22] Filed: Apr. 7, 1998

[51] Int. Cl.⁶ .............. C23C 28/02; C25D 5/02; C25D 5/56
[52] U.S. Cl. ............ 205/184; 205/123; 205/164; 438/687; 438/466
[58] Field of Search .................... 205/123, 164, 205/184; 438/687, 466

[56] References Cited

U.S. PATENT DOCUMENTS

| | | | |
|---|---|---|---|
| 4,113,578 | 9/1978 | Del Monte | 204/15 |
| 4,574,095 | 3/1986 | Baum et al. | 427/53.1 |
| 4,721,550 | 1/1988 | Schumacher, III | 204/15 |
| 4,789,648 | 12/1988 | Chow et al. | 437/225 |
| 5,231,757 | 8/1993 | Chantraine et al. | 29/852 |
| 5,240,497 | 8/1993 | Shacham et al. | 106/1.26 |
| 5,280,154 | 1/1994 | Cuomo et al. | 219/121.52 |
| 5,354,712 | 10/1994 | Ho et al. | 437/195 |
| 5,409,587 | 4/1995 | Sandhu et al. | 204/192.12 |

OTHER PUBLICATIONS

Hartsough et al., "High–Rate Sputtering of Enhanced Aluminum Mirrors", J. Vac. Sci. Technol., vol. 14, No. 1, pp. 123–126, no month available 1977.

*Primary Examiner*—Bruce F. Bell
*Assistant Examiner*—Edna Wong

[57] ABSTRACT

Copper or a copper alloy is electroplated to fill via/contact holes and/or trenches in a dielectric layer. A barrier layer is initially deposited on the dielectric layer lining the hole/trench. A thin conformal layer of copper or a copper alloy is sputter deposited on the barrier layer outside the hole/trench. Copper or a copper alloy is then electroplated on the conformal copper or copper alloy layer and filling the hole/trench. During electroplating, the barrier layer functions as a seed layer within the hole/trench while the sputter deposited conformal copper or copper alloy layer enhances the flow of electrons from the wafer edge inwardly to provide a favorable deposition rate.

14 Claims, 4 Drawing Sheets

METHOD OF ELECTROPLATING A COPPER OR COPPER ALLOY INTERCONNECT

TECHNICAL FIELD

The present invention relates to a method of forming an interconnect by filling an opening in a dielectric layer with copper or a copper alloy. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnect technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally comprising doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trenches typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer can be removed by chemical-mechanical polishing (CMP). One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line. In U.S. Pat. No. 5,635,423, prior art single and dual damascene techniques are disclosed, in addition to several improved dual damascene techniques for simultaneously forming a conductive line in electrical contact with a conductive plug for greater accuracy in fine line patterns with minimal interwiring spacings.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnect pattern. Thus, the interconnect pattern limits the speed of the integrated circuit.

If the interconnect node is routed over a considerable distance, e.g., hundreds of microns or more, as in submicron technologies, the interconnect capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the submicron range, step coverage problems have arisen involving the use of Al, thereby decreasing the reliability of interconnects formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnect paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use of W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) and Cu alloys have recently received considerable attention as a replacement material for Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring. However, there are also disadvantages attendant upon the use of Cu. For example, Cu readily diffuses through silicon dioxide, the typical dielectric interlayer material employed in the manufacture of semiconductor devices, and adversely affects the devices.

One conventional approach in attempting to form Cu plugs and wiring comprises the use of damascene structures employing CMP, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Electroless deposition has been suggested as a technique for forming interconnect structures. See, for example, Shacham et al., U.S. Pat. No. 5,240,497. Electroless Cu deposition is attractive due to low processing costs and high quality Cu deposits. In addition, equipment for performing electroless metal deposition is relatively inexpensive vis-à-vis other semiconductor processing equipment for depositing metals. Electroless deposition also offers the advantageous opportunity for batch processing of wafers, thereby further reducing the cost of electroless deposition and increasing production throughput. However, electroless deposition requires a catalytic surface, i.e., seed layer, for the autocatalytic action to occur. See, for example, Baum et al., U.S. Pat. No. 4,574,095. It is difficult to obtain reliable and reproducible electroless Cu deposition, since the seed layer surface must maintain catalytic activity for effective electroless deposition of Cu.

Application Ser. No. 08/587,264, filed Jan. 16, 1996, now U.S. Pat. No. 5,824,599, discloses a method of electrolessly depositing Cu in an interconnect structure, which method comprises initially depositing a barrier layer in an opening, depositing a catalytic seed layer, preferably of Cu, on the barrier layer, and then depositing a protective layer, the catalytic layer encapsulating and protecting the catalytic layer from oxidation. The preferred protective material is Al which forms an Al—Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

As the aspect ratio of openings for trenches, contacts and vias for interconnect patterns approaches 2:1 and greater, e.g., greater than 3:1, it becomes increasingly more challenging to voidlessly fill such openings employing conventional technology, such as magnatron sputtering techniques involving either direct current or radio frequency sputtering. Conventional attempts to improve sputtering capabilities comprise the use of a collimator as in Sandhu et al., U.S. Pat. No. 5,409,587.

A more recent approach in the evolution of high aspect ratio contact/via interconnect technology involves the ionization of sputtered metals by a high density plasma. Further attempts to improve RF induced plasma processing by generating a greater percent of ionized sputtered material employing a coil having a generally flattened surface defined by parallel conductors is disclosed by Cuomo et al., U.S. Pat. No. 5,280,154.

Although electroless deposition and electroplating offer the prospect of low cost, high throughput, high quality plated films and efficient via, contact and trench filling capabilities, the requirement for a catalytic seed layer becomes problematic, particularly in filling high aspect ratio openings. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. However, for electroless plating, very thin catalytic layers, e.g., less than 100Å, can be employed in the form of islets of catalytic metal.

In copending application Ser. No. 08/857,129 filed on May 15, 1997, pending, a method of electroless plating or electroplating Cu or a Cu alloy to fill high aspect ratio openings is disclosed, wherein a seed layer comprising an alloy of a refractory metal and one or more additive metals is initially deposited.

In copending application Ser. No. 08/898,089, filed on Jul. 23, 1997, a method is disclosed for filling an opening a dielectric layer by pulse electroplating Cu or a Cu alloy from an electroplating composition comprising a leveling agent. In copending application Ser. No. 09/017,676, filed on Feb. 3, 1998, pending a method for electroplating or electroless plating Cu or Cu alloy to fill an opening in a dielectric layer is disclosed employing an underlying Al or Mg alloy for introducing aluminum or magnesium atoms into the electroplated Cu or Cu alloy layer to form an encapsulating protective oxide.

It is recognized that barrier metals, such as W, Ti and compounds thereof, can function as a seed layer for electroplating Cu. However, as electroplated Cu or Cu alloys exhibit poor adhesion to such barrier metals, the use of barrier metal seed layers has been regarded as impractical technology. Moreover, the sheet resistance of such barrier metal layers, at the requisite thickness less than about 1,000Å for electroplating Cu to fill a via/contact hole or trench, is so high that electron conduction for electroplating Cu is not sufficient.

Accordingly, there exists a continuing need for improvements in electroplating Cu or Cu alloys, particularly for voidlessly filling high aspect ratio openings, e.g. aspect ratios greater than 3:1, with improved uniformity and high integrity.

DISCLOSURE OF THE INVENTION

An object of the present invention is a method of electroplating Cu or a Cu alloy to reliably fill openings in a dielectric layer, particularly high aspect ratio contact/via holes and/or trenches.

According to the present invention, the foregoing and other objects are achieved in part by a method of manufacturing a semiconductor device, the method comprising forming an opening in a dielectric layer, the opening having side surfaces and exposing an upper surface of an underlying conductive region or conductive layer forming a bottom surface of the opening; depositing a barrier layer on an upper surface of the dielectric layer and lining the side surfaces and bottom surface of the opening; sputter depositing a substantially conformal layer of Cu or Cu alloy on the upper surface of the dielectric layer with the barrier material layer therebetween; and electroplating Cu or a Cu alloy on the conformal Cu or Cu alloy layer and filling the opening, the barrier layer lining the opening functioning as a seed layer for electroplating within the opening.

Another aspect of the present invention comprises depositing the substantially conformal layer comprising copper or a Cu alloy at a thickness of about 150Å to about 550Å, wherein the sputter deposited conformal layer does not function as a seed layer but enhances the flow of electrons inwardly from the edge of the wafer, thereby providing a favorable electroplating rate for Cu.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the description is to be regarded as illustrative in nature, and not as restrictive.

DESCRIPTION OF THE INVENTION

Figure 1:
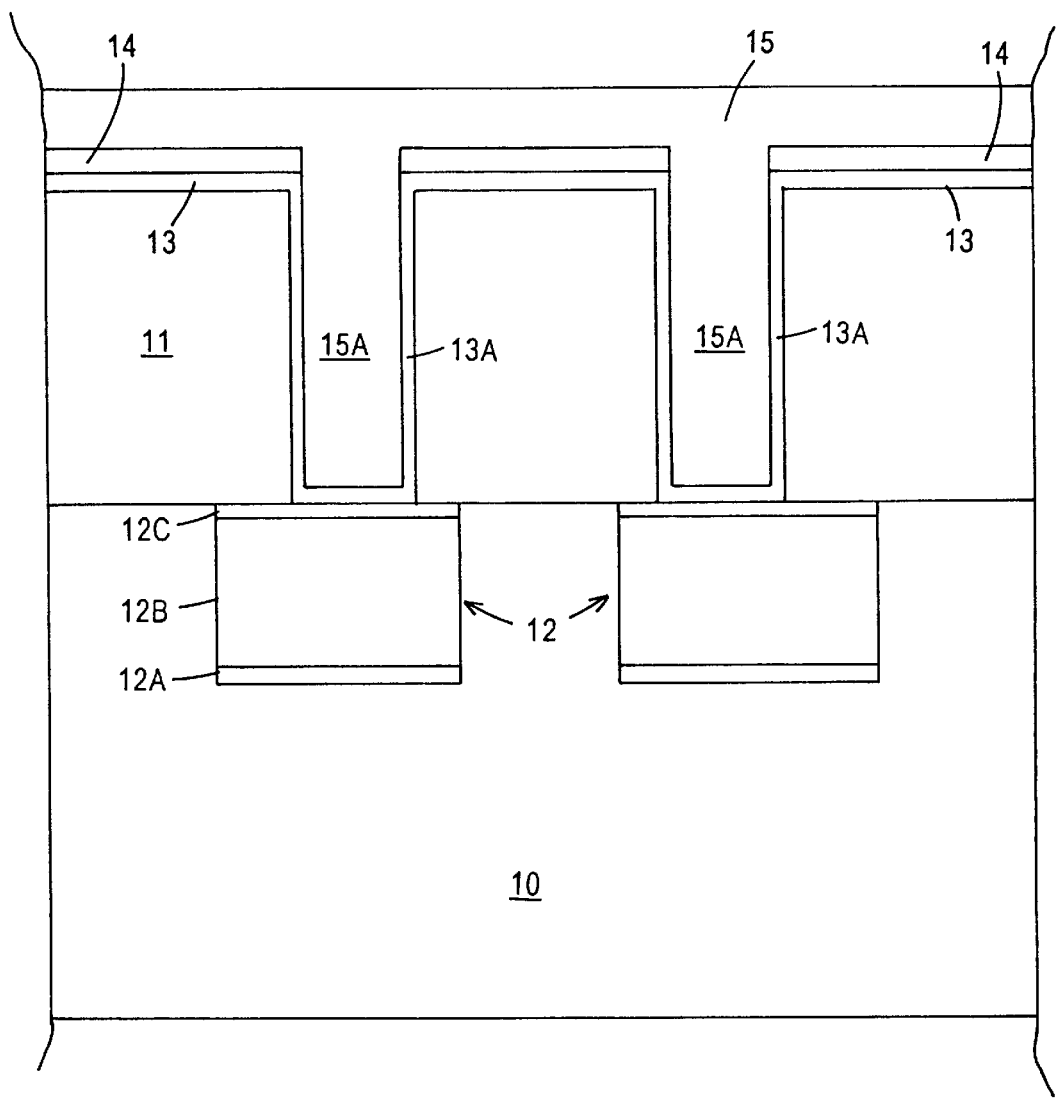
FIGS. 1 and 2 schematically illustrate sequential phases in accordance with an embodiment of the present invention.

The present invention addresses and solves interconnect reliability problems attendant upon electroplating Cu or a Cu alloy (e.g. Cu base alloys containing silicon and/or Al) to fill via/contact holes and/or trenches in a dielectric layer. The solution embodied in the present invention is cost-effective, efficient, increases production throughput and does not require the use of sophisticated or highly complex sputter deposition techniques, such as directionally enhanced sputter deposition techniques employing a collimator or high density plasmas.

Barrier metals such as W, Ti, and compounds thereof, can function as a seed layer for electroplating Cu and Cu alloys by carrying the requisite electrical current. However, in order to function effectively for filling via/contact holes or trenches, the thickness of the seed layer must be less than about 1,000Å. Disadvantageously, at such a low thickness, the sheet resistance of barrier metal layers increases to such an extent that the requisite high electron conduction for Cu plating is not achieved. Accordingly, barrier metals have been regarded as impractical as seed layers in filling via/contact holes or trenches by electroplating Cu or Cu alloys.

The present invention stems from the discovery that an effective electroplating enhancing thin Cu or Cu alloy layer can be sputter deposited by conventional techniques on the surface of the dielectric material in which an opening is formed, without substantially lining the opening. Conventional direct current or RF current magnetron sputtering can be employed to deposit a conformal layer of Cu or a Cu alloy at a thickness of less than about 300Å. The openings in the dielectric layer, particularly high aspect ratio openings of about 3:1 and greater, will generally not have a conformal coating deposited therein. In fact, there is typically no substantial deposition of Cu or Cu alloy on the side surfaces of the opening, although some Cu or Cu alloy deposition may occur at the bottom of the opening.

In accordance with the present invention, the thin layer of Cu or a Cu alloy sputter deposited after forming the opening in the dielectric layer does not function as a seed layer. Rather, the thin Cu or Cu layer exhibits excellent adhesion to the barrier metal and effectively conducts electrons from the edge of the wafer inwardly, since it exhibits a relatively low resistance, e.g. about 5 ohms. On the other hand, within the opening, the barrier layer functions effectively as a seed layer enabling reliable filling of the opening by electroplating Cu or a Cu alloy.

In accordance with embodiments of the present invention, the thin conformal layer of Cu or Cu alloy can be sputter deposited to a thickness of about 150Å to about 500Å, e.g. about 150Å to about 300Å. The thin conformal Cu or Cu alloy layer does not function as a seed layer, but as a low resistance conductive layer to efficiently transfer electrons inwardly toward the opening from the electrode typically provided at the wafer edge, thereby openings in dielectric layers to be effectively and voidlessly filled, particularly high aspect ratio openings, by electroplating Cu or a Cu alloy therein.

In embodiments of the present invention, the barrier material selected does not contain Ta, because an oxide surface will form on Ta, thereby preventing its use as a seed layer. Rather, in accordance with the present invention, barrier layer materials, such as WN, tungsten silicon nitride (WSiN), titanium nitride (TiN), titanium silicon nitride (TiSiN) and titanium-tungsten (TiW) are employed. Thus, the present invention enables effective and efficient electroplating of Cu and Cu alloys in via/contact holes and/or trenches in a dielectric layer, particularly high aspect ratio openings, with high reliability and excellent uniformity.

While conventional practices involve deposition of a Cu or Cu alloy seed layer at a thickness of about 700Å to about 1,500Å, typically about 1,000Å, the present invention employs a sputter deposited Cu or Cu alloy layer at a thickness no greater than about 500Å, e.g. less than about 300Å, which does not function as a seed layer, but provides the requisite low resistance for electron conduction inwardly toward the openings from the wafer edge, thereby enabling efficient and effective filling of openings in dielectric layers. The barrier metal layer within the opening functions as a seed layer and can be deposited at a thickness of less than about 1,000Å.

In filling a via/contact hole, the electroplated Cu or Cu alloy forms a via or contact, respectively. In filling a trench, the electroplated Cu or Cu alloy forms an interconnect line. openings formed in a dielectric layer in accordance with the present invention can be formed by conventional damascene as well as dual damascene techniques wherein an opening is formed comprising a via/contact hole in communication with a trench. Upon filling the opening, a via/contact is formed in electrical connection with the interconnect line.

Figure 2:
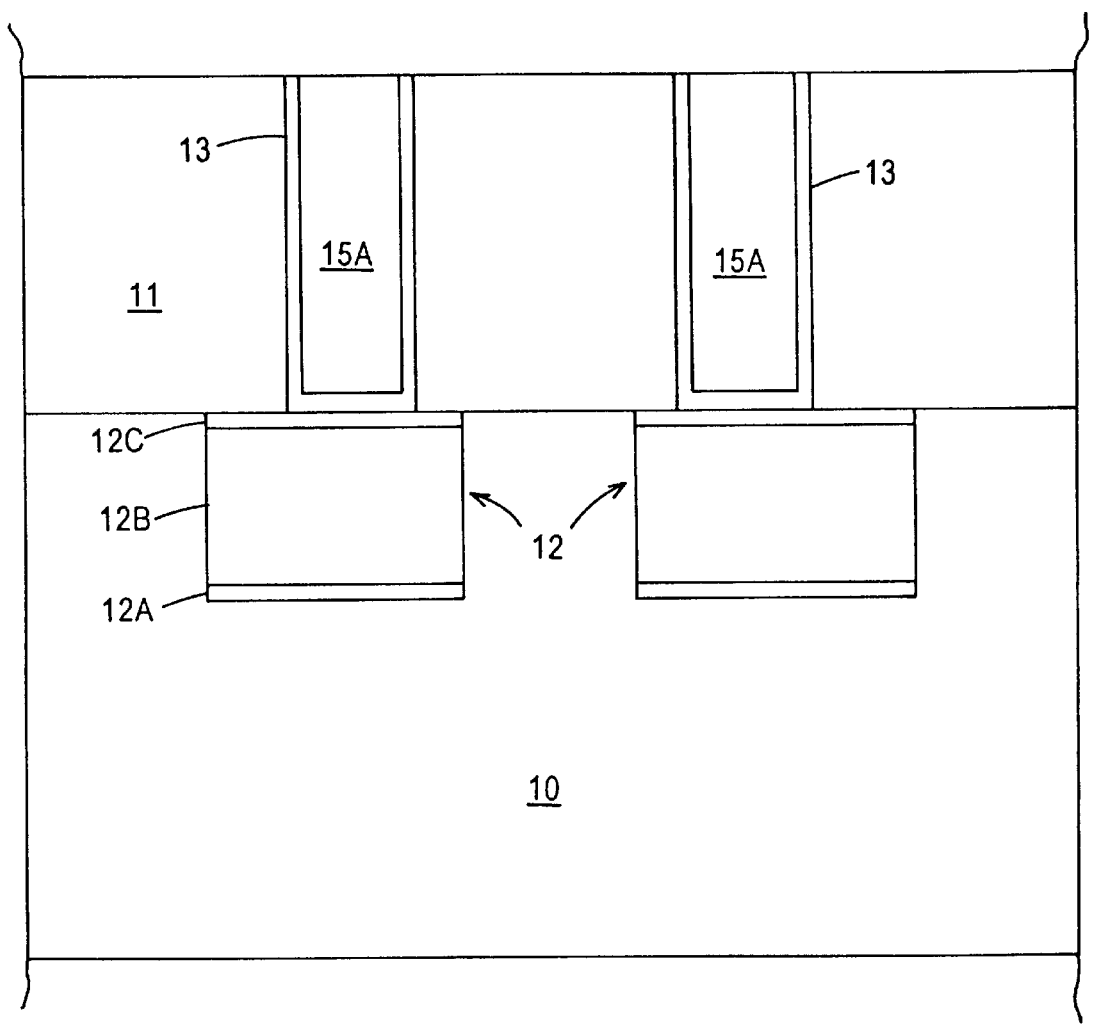

An embodiment of the present invention is schematically illustrated in FIGS. 1 and 2, wherein similar features bear similar reference numerals. Adverting to FIG. 1, dielectric layer 11, such as a dielectric interlayer, is formed on an underlying dielectric layer 10 having metal lines 12 exposed at the surface. Metal lines 12 are formed in a conventional manner and typically are in the form of a composite metal layer comprising an initial Ti layer 12A, an intermediate Al or Al alloy layer 12B, and an upper anti-reflective coating 12C, such as TiN. Via holes are formed in upper dielectric interlayer 11 and a barrier metal layer 13 is deposited, as by a physical vapor deposition, e.g., sputtering. Barrier metal layer 13 is formed on the surface of dielectric interlayer 11 and lines each trench. Barrier metal layer 13 can comprise a material such as W, WN, WSiN, TiN, TiSiN or TiW, and is typically formed at a thickness less than about 1,000Å, such as between about 50Å and less than about 1,000Å.

In accordance with the present invention, a thin layer of Cu or Cu alloy 14 is sputter deposited, employing conventional direct current or radio frequency magnetron sputtering, at a thickness less than about 500Å, e.g. about 150Å to about 300Å, on barrier metal layer 13 on the main surface of upper dielectric interlayer 11. Sputter deposited layer 14 is typically confined to the surface of dielectric interlayer 11 with barrier metal layer 13 therebetween. There is generally no substantial deposition of Cu or Cu alloy within the via holes on the barrier metal layer 13A lining the holes. Subsequently, Cu or a Cu alloy 15 is electroplated to fill the via openings forming plugs 15A and form a layer on the sputter deposit layer 14. Subsequently, planarization is implemented, as shown in FIG. 2, typically by etching and/or CMP. During electroplating, the barrier metal layer 13 lining the holes functions as a seed layer for electroplating Cu or a Cu alloy to fill the holes. The thin sputter deposited layer 14 of Cu or a Cu alloy effectively conducts electrons inwardly toward the holes from the chip edge, as it exhibits a relatively low resistance, typically about 5 ohms, thereby enabling efficient and effective electroplating.

Figure 3:
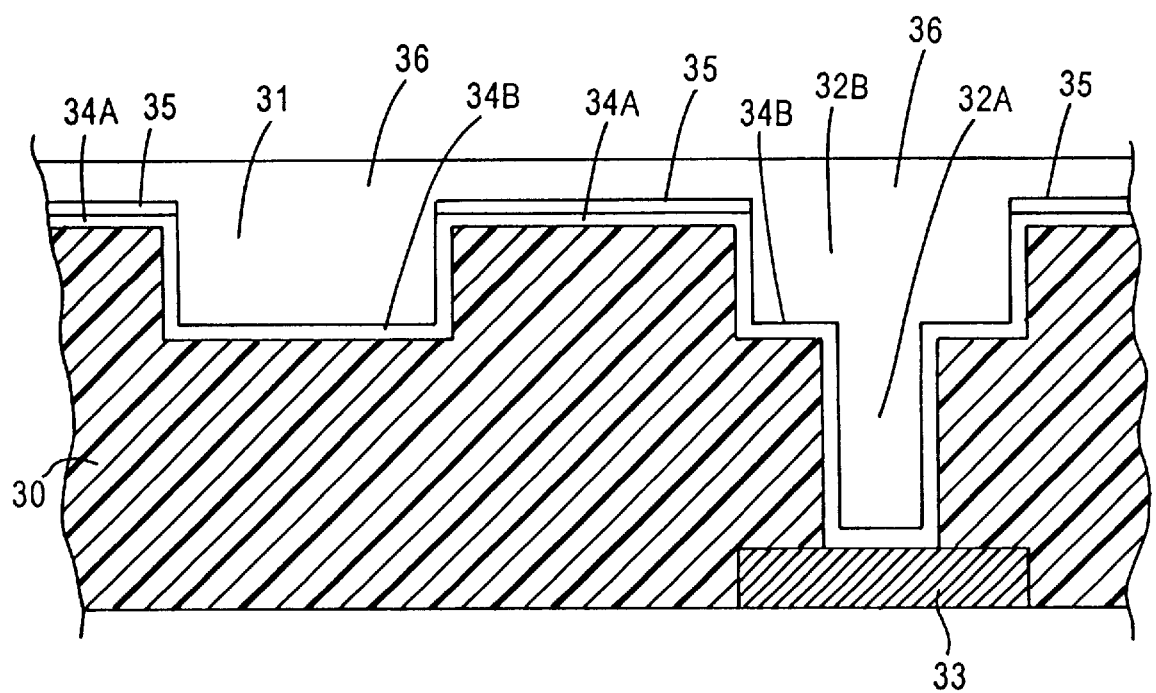
FIGS. 3 and 4 illustrate sequential phases of a method in accordance with another embodiment of the present invention.
Figure 4:
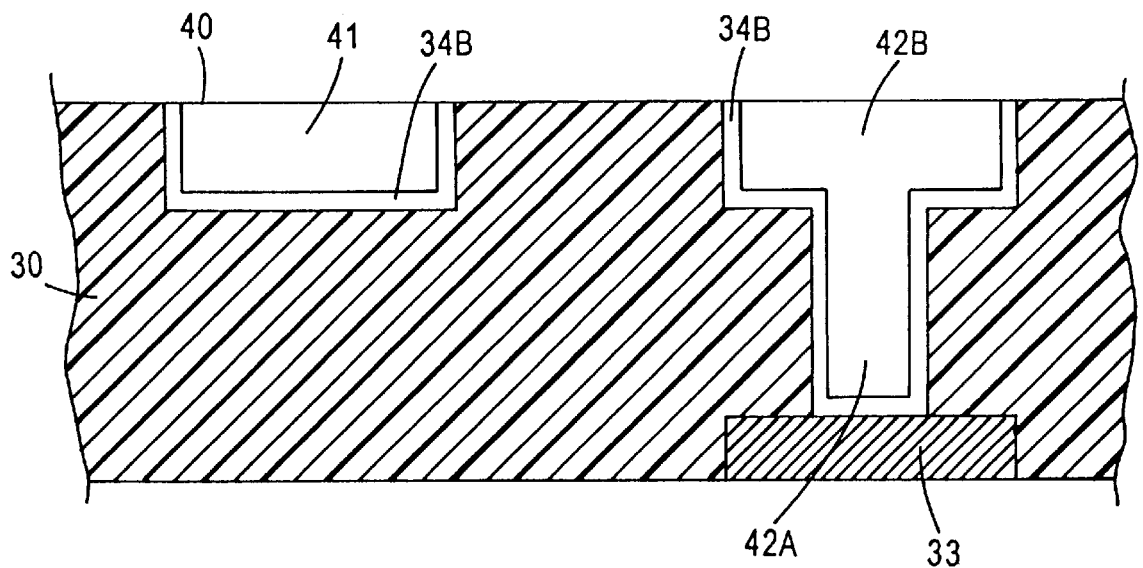

Another embodiment of the present invention is schematically illustrated in FIGS. 3 and 4, wherein similar features bear similar reference numerals. FIGS. 3 and 4 relate to an embodiment wherein Cu or a Cu alloy is electroplated in a trench to form a conductive line and in a dual damascene structure to form a conductive line electrically connected to a via. Adverting to FIG. 3, damascene openings are etched in a conventional manner in dielectric layer 30 typically comprising silicon dioxide. The damascene openings include a trench 31 and a dual damascene opening comprising a via hole 32A in communication with trench 32B. As illustrated, barrier metal layer 13A communicates with an interconnect line 33.

With continued reference to FIG. 3, a barrier metal, such as Ti, W or a compound thereof, is deposited to form a layer 34A on the upper surface of dielectric interlayer 30 and a lining 34B inside the damascene openings. A layer of Cu or a Cu alloy 35 is sputter deposited to a thickness of less than about 500Å on barrier metal layer 34A on the upper surface of dielectric interlayer 30, with substantially no deposition of Cu or Cu alloy within the damascene openings. Cu or a Cu alloy 36 is then electroplated on sputter deposited Cu or Cu alloy 35 and on barrier metal lining 34B within the damascene openings. During electroplating the barrier metal layer lining 34B serves as a seed layer for filling the damascene openings, while the thin sputter deposited Cu or Cu alloy layer 35 outside the damascene openings has a sufficiently low resistance for effective and efficient electron transfer and, hence, enables effective electroplating.

Subsequently, planarization is conducted in a conventional manner, as by etching and/or CMP, to form planarized upper surface 40, as depicted in FIG. 4. Electroplated Cu or a Cu alloy filling damascene opening 31 (FIG. 3), forms interconnect line 41, while a dual damascene structure comprising via 42A connected to interconnect line 42B is formed in via opening 32A and trench 32B, respectively.

The present invention enables openings in dielectric layers, such as damascene openings, particularly openings having high aspect ratios, to be reliably filled in a cost effective manner by initially depositing a barrier metal layer and subsequently sputter depositing a thin Cu or Cu alloy layer on the barrier metal layer portion formed on the dielectric layer, with substantially no Cu or Cu alloy deposited on the barrier metal layer within the openings. The thin sputter deposited Cu or Cu alloy layer exhibits a desirably low resistance to facilitate electron transfer from the chip edge inwardly and, hence, enables electroplating of Cu or a Cu alloy, while the barrier metal layer within the trench functions as a seed layer. The present invention enables reliable filling of high aspect ratio openings in a simplified manner without resorting to sophisticated and highly complex directional sputtering techniques.

In the previous descriptions, numerous specific details are set forth in order to provide a better understanding of the present invention. However, the present invention can be practiced without resorting to the details specifically set forth. In other instances, well known processing structures have not been described in detail in order not to unnecessarily obscure the present invention.

Only the preferred embodiment of the invention and examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising:

forming an opening in a dielectric layer, the opening having side surfaces and exposing an upper surface of an underlying conductive region or conductive layer forming a bottom surface of the opening;

depositing a barrier layer on an upper surface of the dielectric layer and lining the side surfaces and bottom surface of the opening;

sputter depositing a substantially conformal layer of copper or copper alloy on the upper surface of the dielectric layer with the barrier layer therebetween; and electroplating copper or a copper alloy on the conformal Cu or Cu alloy layer and filling the opening, the barrier layer lining the opening functioning as a seed layer for electroplating within the opening.

2. The method according to claim 1, comprising sputter depositing the substantially conformal layer at a thickness of about 150Å to about 500Å.

3. The method according to claim 2, comprising sputter depositing the substantially conformal layer at a thickness of about 150Å to about 300Å.

4. The method according to claim 1, wherein the sputter deposited substantially conformal layer does not function as a seed layer.

5. The method according to claim 1, wherein the barrier metal comprises tungsten, tungsten nitride, tungsten silicon nitride, titanium nitride, titanium silicon nitride or titanium-tungsten.

6. The method according to claim 1, comprising depositing the barrier metal at a thickness of about 50Å to about less than 1,000Å.

7. The method according to claim 1, wherein:

the opening comprises a trench; and the electroplated copper or copper alloy filling the trench forms an interconnect line.

8. The method according to claim 7, wherein:

the opening further comprises a via/contact hole communicating with the trench; and the electroplated copper or copper alloy filling the opening comprises a first portion filling the trench forming the interconnect line and a second portion filling the hole and forming a via/contact in electrical contact with the line.

9. The method according to claim 1, wherein:

the opening comprises a contact/via hole; and the electroplated copper or copper alloy filling the hole forms a contact/via.

10. The method according to claim 1, comprising sputter depositing the substantially conformal layer by direct current or radio frequency magnetron sputtering.

11. A method of manufacturing a semiconductor device, the method comprising:

forming an opening in a dielectric layer, the opening having side surfaces and exposing an upper surface of an underlying conductive region or conductive layer forming a bottom surface of the opening;

depositing a barrier layer on an upper surface of the dielectric layer and lining the side surfaces and bottom surface of the opening;

sputter depositing a substantially conformal layer of copper or copper alloy on the upper surface of the dielectric layer with the barrier layer therebetween such that substantially no copper or copper alloy is deposited on the side surfaces of the opening; and electroplating copper or a copper alloy on the conformal Cu or Cu alloy layer and filling the opening, the barrier layer lining the opening functioning as a seed layer for electroplating within the opening.

12. The method according to claim 11, comprising sputter depositing the conformal layer such that substantially no copper or copper alloy is deposited on the bottom surface of the opening.

13. The method according to claim 11, comprising sputter depositing the substantially conformal layer at a thickness of about 150Å to about 500Å.

14. The method according to claim 13, comprising sputter depositing the substantially conformal layer at a thickness of about 150Å to about 300Å.

* * * * *